(12) United States Patent
Modi

(10) Patent No.: US 6,590,780 B2
(45) Date of Patent: Jul. 8, 2003

(54) OPERATING MECHANISM

(75) Inventor: Jayesh Jayantilal Modi, Burwood East (AU)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/223,023

(22) Filed: Aug. 16, 2002

(65) Prior Publication Data

US 2003/0039107 A1 Feb. 27, 2003

(30) Foreign Application Priority Data

Aug. 23, 2001 (DE) .......................... 101 41 400

(51) Int. Cl.[7] .............................. H05K 5/02; H05K 7/02
(52) U.S. Cl. ...................... 361/752; 361/736; 174/50; 439/76.2
(58) Field of Search .................... 361/752, 736; 174/50, 50.52; 439/76.2

(56) References Cited

U.S. PATENT DOCUMENTS

| 4,689,718 A | * | 8/1987 | Maue et al. ............... 361/360 |
| 4,944,684 A | * | 7/1990 | Leibowitz .................. 439/76 |
| 5,771,151 A | * | 6/1998 | Hotea et al. .............. 361/626 |
| 5,782,651 A | * | 7/1998 | Konoya .................... 439/405 |
| 5,902,138 A | * | 5/1999 | Murakami ................. 439/76.2 |
| 5,995,380 A | * | 11/1999 | Maue et al. .............. 361/826 |
| 6,008,982 A | * | 12/1999 | Smith ...................... 361/624 |
| 6,062,876 A | * | 5/2000 | Oda ......................... 439/76.2 |
| 6,116,916 A | * | 9/2000 | Kasai ....................... 439/76.2 |
| 6,162,990 A | * | 12/2000 | Sakamoto .................. 174/59 |
| 6,220,875 B1 | * | 4/2001 | Kawakita .................. 439/76.2 |
| 6,353,190 B1 | * | 3/2002 | Sumida et al. ............ 174/261 |
| 6,437,986 B1 | * | 8/2002 | Koshiba ................... 361/752 |

FOREIGN PATENT DOCUMENTS

DE 199 53 191 A1 5/2001

* cited by examiner

Primary Examiner—David Martin
Assistant Examiner—Dameon E. Levi
(74) Attorney, Agent, or Firm—Michael J. Striker

(57) ABSTRACT

An operating mechanism (1) includes a housing and a printed circuit board (6) having an electronic switch part disposed in the housing. A punched grid (7) has at least one punched grid plane (8) running parallel to the circuit board (6). The punched grid is electrically connected to the circuit board (6) by means of contact sections (18) bent off from the punched grid plane (8) and connected to electric components (10, 11) that are connected to the circuit board and/or punched grid. The housing has a first housing part (2) with a housing wall (21) running parallel to the circuit board (6) and the punched grid plane (8). First connecting elements (12) are electrically connectable with second contact sections (19) of the punched grid (7), and the second connecting elements (14) are electrically connectable with discrete contact elements arranged on the circuit board (6).

11 Claims, 2 Drawing Sheets

OPERATING MECHANISM

BACKGROUND OF THE INVENTION

The present invention relates to an operating mechanism. A type of operating mechanism is disclosed, for example, in DE 199 53 191 A1. This type of operating mechanism has a printed circuit board with an electronic actuator and, in addition, a punched grid electrically connected to the circuit board for conducting strong currents. Electrical components, which are operated with strong currents, are in contact with the punched grip in the housing of the operating mechanism, while other components are electrically connected directly with the conducting leads of the conductor plate.

SUMMARY OF THE INVENTION

The operating mechanism of the present invention makes it possible to simultaneously contact electrical components, which have first connecting elements for high current and second connecting elements for operating signals, to the punched grid and the printed circuit board, with both a simple and cost efficient construction of the operating mechanism. Advantageously, the electrical components, such as relays, are plugged in or inserted from outside onto a housing wall of the operating mechanism, whereby the connecting elements penetrate through recesses in the housing wall, and whereby first connecting elements for high current are electrically connected with contact sections of the punched grid and second connecting elements for signal current are electrically connected with discrete contact elements disposed on the circuit board and there, connected with the electronic actuator. Since signal currents, for example, electric control signals for controlling a relay coil, of at least one electric component are supplied via the circuit board, the punched grid can be quite simple constructed. The individual conductor leads of the punched grid can be arranged narrowly, without the necessity for reducing the width of the circuit board. The punched grid is therefore better suited for high current conduction and enables an efficient heat conductance of the heat produced by the electric components.

Advantageously, the discrete contact elements arranged on the circuit board and the second contact elements of the punched grid are formed as clamp contacts, so that the electrical components can be detachably secured on the housing wall by insertion onto the housing wall of the operating mechanism.

Advantageously, one embodiment of the operating mechanism of the present invention has a further punched grid plane that is arranged in a second housing part, which forms an L-shaped housing with the first housing part. The spacious construction of the operating mechanism makes possible mounting second components at right angles to the first components from outside on the housing, whereby the high current connectors of the second components are contacted through openings in the housing with the punched grid.

Further, a method for making the operating mechanism is provided, in which the punched grid first is mounted in a housing part, the circuit board is next placed on the punched grid and welded to it. The welding takes place in a single welding process, which is performed on the circuit board, whereby bent or offset first contact sections of the punched grid are welded together with connections from components lined up on the circuit board.

DETAILED DESCRIPTION OF THE PREFERRED EMBODIMENTS

Figure 1:
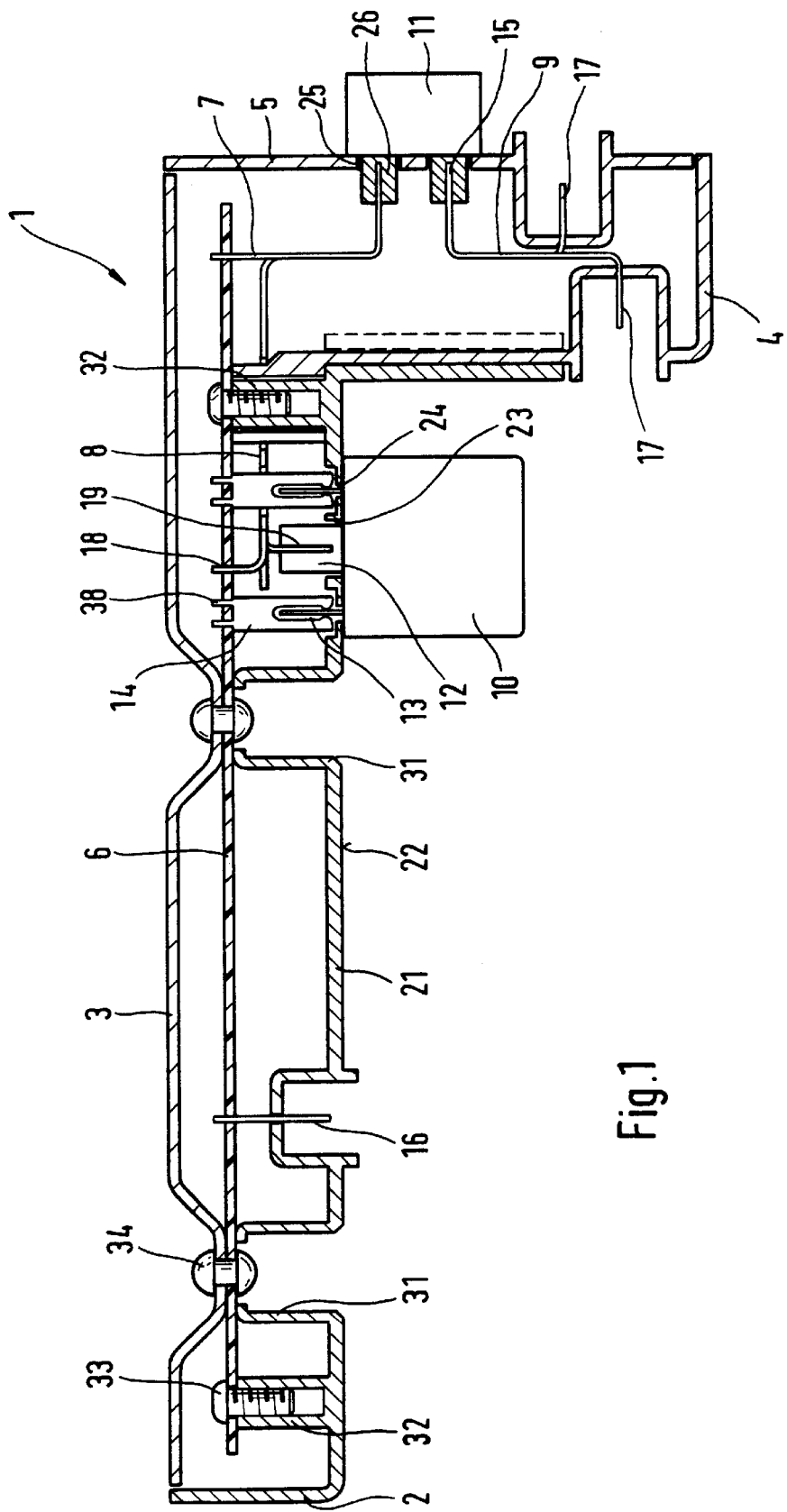
FIG. 1 shows a cross section through a first embodiment of the operating mechanism of the present invention.

FIG. 1 shows a first embodiment of the operating mechanism of the present invention, in particular, an operating mechanism for an automobile, which includes a printed circuit board 6 that is provided with electrical and electronic components, which form an electronic control switch. The operating mechanism has a first housing part 2 and a second housing part 4 that is connected to the first housing part 2 in a manner forming an L-shaped housing. A first cover part 3 is placed on the first housing part 2 and on the second housing part 4 is a second cover part 5. The first housing part 2, the second housing part 4, and the two cover parts 3, 4 together form a closed, complete housing. The circuit board 6 is mounted in the first housing part 2 on a platform 31 projecting inwardly from a housing wall 21 and peg 32 and by means of a screw 33, is fastened to the peg 32. Further, a punched grid 7 is provided, which is made by punched or pressing out of metal sheet. The conductor leads of the punched grid, connected to one another via cross bars are separated after assembly, so that the individual conductor leads are separated electrically from one another. The punched grid 7 has a first punched grid plane 8, which is arranged parallel to the circuit board 6. From the punched grid plane 8, deflected first contact sections 18 are electrically connected with the circuit board 6. The contact sections 18 penetrate through metallized holes of the circuit board and on the back site, welded with the circuit board. As see in FIG. 1, second contact sections 29 are deflected or bent from the punched grid plane 8 such that they stand up on the side of the punched grid 7 facing away from the circuit board 6 to the housing wall 21 of the housing part 2. The housing wall 21 is provided with first openings 23 and second openings 24. In addition, the circuit board 6 is provided with discrete contact elements 14, which, for example, have contact pins 38 that penetrate through openings in the circuit board and are welded on the backside with the circuit board 6 or are pressed in the circuit board. The contact elements 14 are made of metal and are electrically connected with the control switch on the circuit board 6. The ends of the discrete contact elements 14 projecting toward the housing wall 21 and the second contact sections 19 of the punched grid 7 are provided with clamp contacts. The clamp contacts, for example, can be formed as clamp- or pincher-shaped with two clamp legs and are disposed near the first opening 23 and the second opening 24. A first electrical component on the outer side 22 of the housing wall 21 engages with first connecting elements 12 through the first opening 23 of the housing wall 21 into the clamp contacts 19 of the punched grid 7 and with second connecting elements 13 through the second openings 24 into the clamp contacts of the contact elements 14. The first electrical component 10 operates preferably as a relay, whose second connecting elements 13 are connected with the coil of the relay and via whose first connecting elements 12 a power current is fed. As shown in FIG. 1, the discrete contact elements 14 on the circuit board 6 served for signal delivery, while the contact sections 19 of the punched grid are used for supplying the power current. Therefore, since the signal flow is not supplied by means of the punched grid, the construction of the punched grid can be greatly simplified.

As can be seen further from FIG. 1, a second punched grid plane 9 is bent out of the first punched grid plane at a right angle to the circuit board 6 and is arranged within the second housing part 4. A second electrical component 11, for example, a safety, is placed from outside on the cover part 5 and engages with its connecting elements 26 through opening 25 in the cover part 5 into clamp contact of the punched grid 7, which are bent out of the second punched grid plane 9.

Third contact sections 17, which are bent out from the second punched grid plane 9, in this embodiment are guided through the cover part 5 and/or the second housing part 4 outwardly. The contact sections 17 form connectors for power currents. The contact pins 16 disposed on the circuit board are guided outwardly through the housing wall 21 and form a connector for signal flow. The first cover part 3 is attached by means of rivets 34 on the platform 31 of the first housing part 2, so that the circuit board 6 fixed between the first housing part 2 and the first cover part 3.

Figure 2:
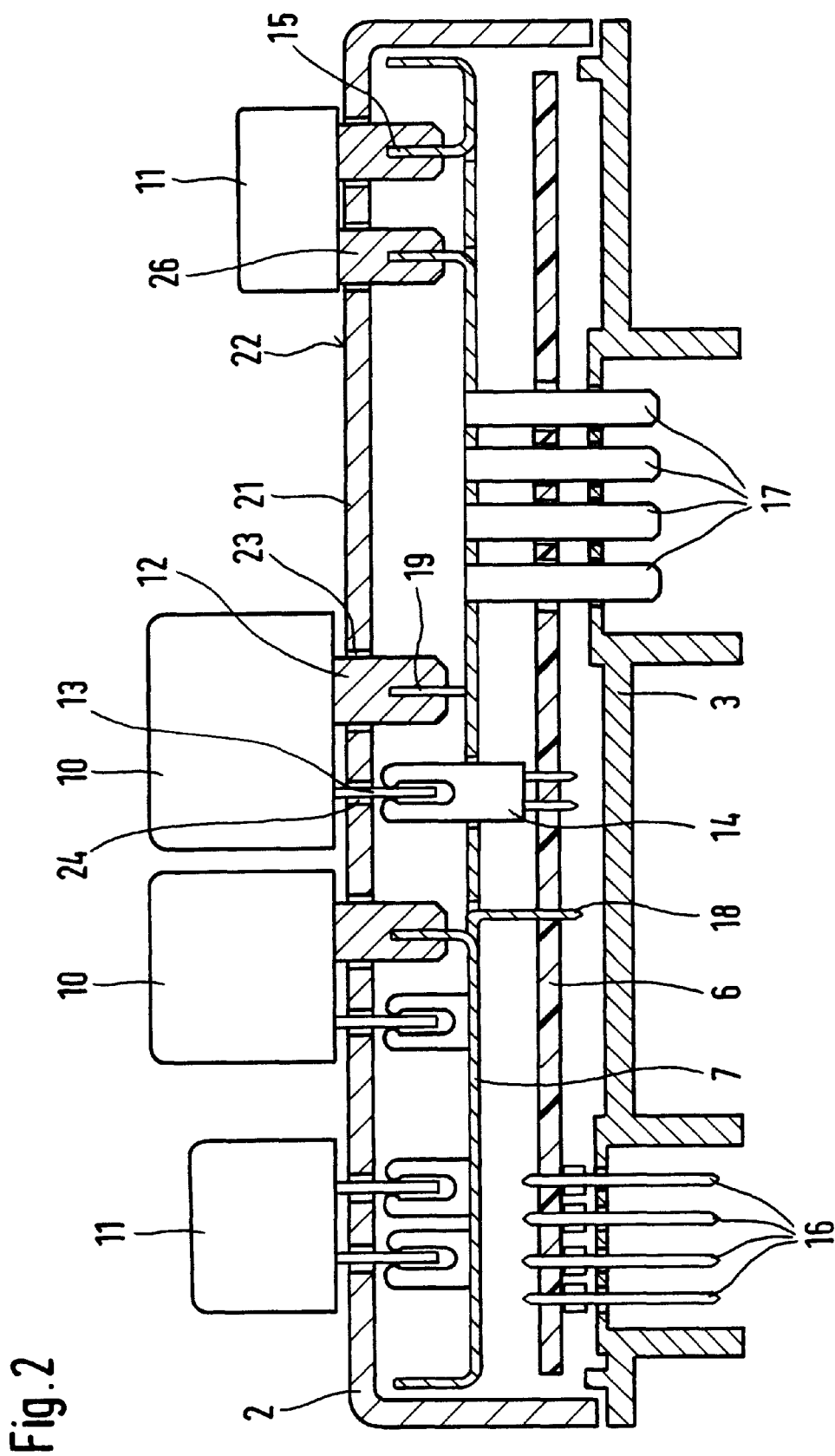
FIG. 2 shows a cross section through a second embodiment of the operating mechanism of the present invention.

A second embodiment of the operating mechanism of the present invention is represented in FIG. 2. The same parts are designated with the same reference numerals. In the embodiment of FIG. 2, the housing is flat and includes two housing parts 2 and 3. With this embodiment, multiple relays 10 and safety mechanisms 11 are disposed on a common housing wall 21 of the operating mechanism, while the contact pins 16 of the connector for the control switch part and the contact sections 17 of the connector for the power part are arranged on a housing wall, which lies opposite the housing wall 21.

When make the operating mechanism, the following method is used. The punched grid 7 is made from a metal sheet and subsequent bending of the first contact sections 18 and the second contact sections 19 from a first punched grid plane 8. During the manufacturing, the ends of the second contact sections 19 are provided with contact clamps. The punched grid 7, made is this manner, is placed in a first housing part, whereby this first punched grid plane 8 runs parallel to a housing wall 22 of the housing part 2 and the first contact sections 18 are facing away from the housing wall 21 and the second contact section 19 face toward the housing wall 21. Then, the circuit board 6, provided with the electronic switch part, is placed in the housing part 2 and the first contact sections 18 are welded with the contact surfaces of the circuit board 6. This welding process can be performed advantageously with the welding of other electric components on the circuit board 6, for example, such as the discrete contact elements 14, which are welded with their contact pins 38 onto the circuit board 6. After welding, the first housing part 2 is connected with the first cover part 3. First components 10, for example, relays, and second components 11, for example, electrical safety mechanisms, can be attached now from outside onto the housing of the operating mechanism, without the need to open the operating mechanism.

It will be understood that each of the elements described above, or two or more together, may also find a useful application in other types of constructions differing from the types described above.

While the invention has been illustrated and described herein as an operating mechanism, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

What is claimed is:

1. Operating mechanism (1), comprising a housing and a printed circuit board (6) disposed in said housing, said circuit board (6) having a switch part, a punched grid (7) with at least one punched grid plane (8) arranged parallel to the circuit board (6), wherein said punched grid is electrically connected to the circuit board (6) by means of first contact sections bent out from said punched grid plane (8), said punched grid plane also being connected to electric components (10, 11) connectable to said circuit board and/or the punched grid, wherein the housing has a first housing part (2) with a housing wall (21) running parallel to the circuit board (6) and to the punched grid plane (8), wherein at least one first electrical component (10) is fixable on an outer side (22) of the housing wall (21), wherein first connecting elements (12) and second connecting elements (13) of the at least one first electrical component (10) pass through openings (23, 24) of the housing wall (21), wherein the first connecting elements (12) are electrically connectable with second contact sections (19) of the punched grid (7) and the second connecting elements (13) are electrically connectable with discrete contact elements (14), said contact elements arranged on said circuit board (6) and projecting to said housing wall (21), wherein the second contact sections (19) of the punched grid (7) are high current connectors and the discrete contact elements (14) arranged on the circuit board are low current connectors.

2. Operating mechanism as defined in claim 1, wherein the second contact sections (19) of the punched grid (7) are deflected toward the housing wall (21) and are formed as clamp contacts, wherein the contact elements (14) disposed on the circuit board (6) are also formed as clamp contacts (14).

3. Operating mechanism as defined in claim 1, wherein the at least one electrical component is a relay.

4. Operating mechanism as defined in claim 1, wherein third contact sections (17) of the punched grid (7) are bent out from the punched grid plane (8) and/or the further punched grid plane (9) and pass outwardly through the housing.

5. Operating mechanism as defined in claim 4, wherein the third contact sections (17) form a first connector for a connection of power currents.

6. Operating mechanism (1), comprising a housing and a printed circuit board (6) disposed in said housing, said circuit board (6) having a switch part, a punched grid (7) with at least one punched grid plane (8) arranged parallel to the circuit board (6), wherein said punched grid is electrically connected to the circuit board (6) by means of first contact sections bent out from said punched grid plane (8), said punched grid plane also being connected to electric components (10, 11) connectable to said circuit board and/or the punched grid, wherein the housing has a first housing part (2) with a housing wall (21) running parallel to the circuit board (6) and to the punched grid plane (8), wherein at least one first electrical component (10) is fixable on an outer side (22) of the housing wall (21), wherein first connecting elements (12) and second connecting elements (13) of the at least one first electrical component (10) pass through openings (23, 24) of the housing wall (21), wherein the first connecting elements (12) are electrically connectable with second contact sections (19) of the punched grid (7) and the second connecting elements (13) are electrically connectable with discrete contact elements (14), said contact elements arranged on said circuit board (6) and projecting to said housing wall (21), wherein a further punched grid plane (9) is angled at a right angle from the punched grid plane (8) running parallel to the circuit board (8), wherein the punched grid plane (9) is arranged in a second housing part (4), and wherein said second housing part (4) and said first housing part (2) together form an L-shaped housing.

7. Operating mechanism as defined in claim 6, wherein at least one second electrical component (11) is provided, said at least one second electrical component (11) has connecting elements (26), wherein said connecting elements (28) pass through further openings (25) in the housing and are connectable with fourth contact sections (26) of the punched grid (7) in clamping contact.

8. Operating mechanism as defined in claim 6, wherein the first housing part (2) is closed with a first cover part (3) and wherein the second housing part (4) is closed with a second cover part (5).

9. Operating mechanism as defined in claim 7, wherein said at least one second electrical component is a safety mechanism.

10. Operating mechanism as defined in claim 8, wherein contact pins (16) connected with the circuit board (6) pass outwardly through the housing wall (21) and/or the first cover part (3).

11. Operating mechanism as defined in claim 10, wherein the contact pins (16) form a second connector for the connection of power currents.

\* \* \* \* \*